(12) United States Patent
Flanders et al.

(10) Patent No.: US 7,317,374 B2
(45) Date of Patent: Jan. 8, 2008

(54) SELF-DAMPED INDUCTOR

(75) Inventors: Andrew E. Flanders, Cornelius, OR (US); Andrew Bartha, Gaston, OR (US); Bradley E. Judah, Cornelius, OR (US)

(73) Assignee: NuCore, Inc., Hillsboro, OR (US)

( * ) Notice: Subject to any disclaimer, the term of this patent is extended or adjusted under 35 U.S.C. 154(b) by 310 days.

(21) Appl. No.: 10/750,214

(22) Filed: Jan. 2, 2004

(65) Prior Publication Data

US 2004/0207503 A1  Oct. 21, 2004

Related U.S. Application Data

(60) Provisional application No. 60/438,068, filed on Jan. 3, 2003.

(51) Int. Cl.
*H01F 17/09* (2006.01)
*H04R 1/02* (2006.01)

(52) U.S. Cl. ............... 336/220; 336/221; 336/182; 381/94

(58) Field of Classification Search ........ 336/182–183, 336/180, 212, 92, 220–222; 381/110, 111, 381/99, 94.1

See application file for complete search history.

(56) References Cited

U.S. PATENT DOCUMENTS

| | | | | |
|---|---|---|---|---|
| 4,176,335 A | * | 11/1979 | Charpentier | 336/180 |
| 4,901,048 A | * | 2/1990 | Williamson | 336/180 |
| 4,940,921 A | * | 7/1990 | Helling et al. | 315/219 |
| 5,072,158 A | * | 12/1991 | Schuda | 315/276 |
| 5,373,563 A | * | 12/1994 | Kukurudza | 381/94.9 |
| 5,768,113 A | * | 6/1998 | Safraoui | 363/17 |
| 6,144,193 A | * | 11/2000 | Illingworth | 323/284 |

* cited by examiner

*Primary Examiner*—Anh Mai
(74) *Attorney, Agent, or Firm*—Jones, Tullar & Cooper, P.C.

(57) ABSTRACT

An inductor with self-damping properties for use in multiple applications including for high power broadband frequency applications is provided by a coil having an input end and an output end and wound about a core of magnetically permeable material and an eddy current generator incorporated either at the time of manufacture or post manufacturing. The core can be air (e.g., a hollow coil of wire). Alternative core materials are iron, iron powder, steel laminations and other appropriate materials. The core may be incorporated into some form of frame whether I shaped, U shaped, E shaped or of an encapsulated shape arrangement. The inductor's Q value may be changed selectively by deliberately inducing eddy currents in preferred locations. The eddy currents are induced into the inductors and have the effect of introducing a back EMF which is designed and scaled appropriately to adjust the Q value at the desired frequency resulting is less phase distortion. When phase "distortion" is minimized, waveform is necessarily well preserved. The listener then observes improved clarity, identity, vitality and intelligibility. The phase angle within the response band depends on the roll-off or roll-up slope, be it a $1^{st}$, $2^{nd}$ or $3^{rd}$ order. One self damped inductor includes an iron double "E" core inductor carrying a primary coil of insulated copper wire wound around an iron core. Core is formed by the central leg of an "E" frame pair and carries an eddy current generating winding implemented by winding an electrically conductive insulated and isolated secondary coil around the outside of the primary winding. An electrical connection is established between the two ends of the secondary coil. The secondary coil preferably comprises a single turn of wire but may consist of a thicker gauge wire or of multiple turns if it is desirable to increase the magnitude of the eddy currents generated.

9 Claims, 11 Drawing Sheets

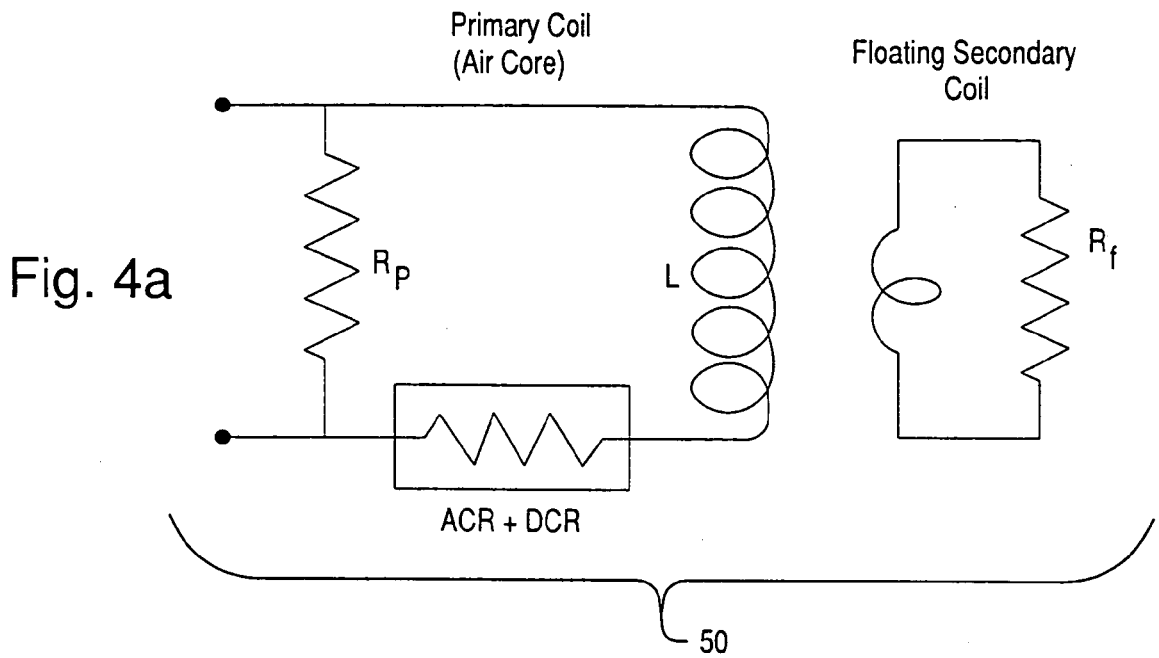
Fig. 4a
Fig. 4b
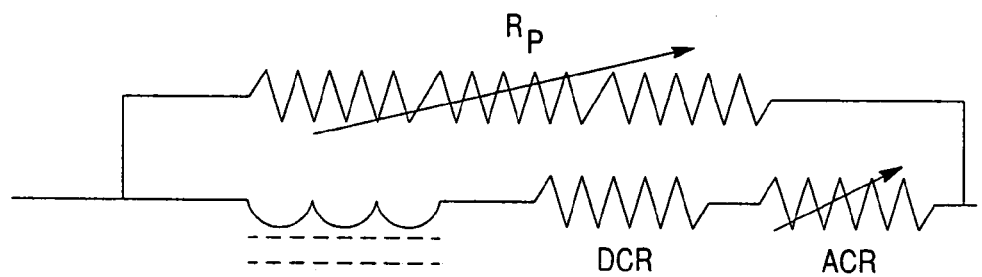
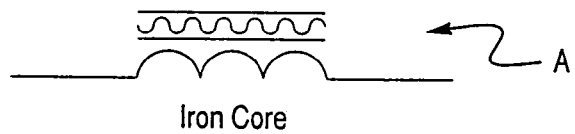
Fig. 4c
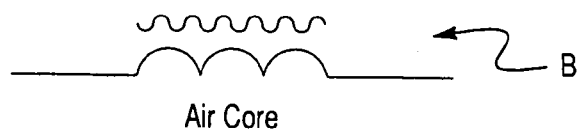
Fig. 4d

Interlaced Response

SELF-DAMPED INDUCTOR

RELATED APPLICATION INFORMATION

This application is a continuation of and claims priority to U.S. provisional application Ser. No. 60/438,068, filed Jan. 3$^{rd}$, 2003, the entire disclosure of which is incorporated herein by reference.

This application is also related to the commonly owned PCT application serial number PCT/US01/28152, entitled High Efficiency Inductor, filed Sep. 6$^{th}$, 2001, the entire disclosure of which is also incorporated herein by reference.

This application is also related to the commonly owned Provisional application Ser. No. 60/231,191, entitled Shielded Inductor, filed Sep. 7th, 2000, the entire disclosure of which is also incorporated herein by reference.

BACKGROUND OF THE INVENTION

1. Field of the Invention

The present invention relates to manufacture and use of energy storing electrical components of the type referred to generically as inductors. Inductors are often used in tuned or resonant electrical circuits such as filters, oscillators or amplifiers and, in operation, convert energy in the form of electrical current flow "I" to (or from) energy in the form of a magnetic field "B" comprising closed loops of magnetic flux, as shown in FIG. 1.

2. Discussion of the Prior Art

Inductors are often used in power conversion circuits, especially in the form of transformers for Alternating Current (AC) voltage conversion and the like.

Inductors are also often used in signal dividing filters as part of loudspeaker crossover networks. Often, high power applications such as low frequency or subwoofer loudspeakers require crossover network inductors to function without saturating while passing large amounts of signal current. Coil saturation problems limit power handling and force designers to use large and expensive inductor structures.

Conventional air-core or solid-core inductors of the prior art such as the solid core inductor of FIG. 1 permit lines of magnetic flux "B" to travel through the air or any other matter which happens to be surrounding the inductor. As a result, there is uneven control over the entire flux path and so much of the flux is considered "stray", to the detriment of the inductor's performance.

High fidelity loudspeaker systems are typically made with two or more transducers or drivers, each having a different frequency response. The division of energy between portions of the audio spectrum to each transducer is accomplished with crossover networks to achieve maximum efficiency. Crossover networks are filters that include combinations of resistors, capacitors and inductors. With the advent of high-power audio sound systems, the need for high-power handling crossover inductors has become acute. The broadband spectrum of nearly a dozen octaves exhibited by much of the music further requires crossover networks that properly direct particular segments of the audio spectrum to appropriately receptive loudspeaker drivers. Such drivers may be categorized as covering the frequency regions of contra-bass, sub-bass, bass, mid-range and high frequencies.

Because of the way the human ear responds to sound, the greatest demand for power occurs in the sub-bass and bass frequencies. In order to supply these frequencies at sufficient power levels to the appropriate driver, a crossover network needs to reject all higher frequencies without depressing the amplitude of the bass frequencies in any significant way.

Recent studies have confirmed that phasing of harmonics has a direct impact on the perception of tonal character and timbre. Further, the phase throughout the audio spectrum and wiring of electronic networks affects the sound, particularly near the bandpass extremes for each transducer of the overall sound system in which the slope of roll-off or roll-up gain contributes to the phasing well into the "flat" response region (occurring as prescribed by Bode and other researchers). The ear identifies the various harmonics or inharmonics (partials) in their relative strength throughout the ear's response spectrum developing a "formant" glossary consisting of many recipes.

The Q of an inductor provides a figure of merit as to its quality describing its loss characteristics at a specified frequency. It being frequency dependent, the Q is usually measured at 120 Hz and 1 kHz, and a measure of ohmic Direct Current Resistance (DCR) is usually also provided. The applicants have discovered that these provide an incomplete picture, however, because additional momentary characteristics or "components" are manifest that are dynamic in nature. When considered as in-series elements, $Q=X_L/R_{AC}$ where $X_L$ is the inductive resistance and $R_{AC}$ is the resistance factor which includes all loss factors including the DC resistance of the winding. There is an induced series resistance $R_S$ that represents a loss or barrier to current at the specified frequency and is present as long as a signal having that frequency passes through the inductor. This resistance includes copper eddy current loss, iron eddy current loss and hysteresis loss of the magnetic material, all of which must be compensated for by the amplifier into its load. This resistance is often considered as a parallel resistance $R_P$ across the inductor and is related by the dissipation factor D where $D=1/Q$, since Q varies proportionately with $X_L$ which, in turn, is a function of frequency, and so it follows that $R_S$ increases with frequency.

When considering inductors for use in audio applications, this means that the bass audio output becomes depressed in the presence of a high frequency input because of an increase in $R_S$. In other words, sound that includes a significant high frequency component leads to a rise in the "invisible" AC resistance of the inductor thereby decreasing its efficiency for as long as the high frequency signal lasts. This consideration is therefore a significant problem in broadband performance over several octaves of audio. When considered as in-parallel elements, $Q=R_P/X_L$, in a given network, the response slope is selectable in magnitude as well as frequency region. The applicants have discovered that, for example, if a 6 dB/octave roll-off could be decreased to −4 db or −5 dB/octave on its lower skirt, the result would be a noticeable improvement in tone quality (per Bode).

In the past, manufacturers have principally turned to iron lamination cores to minimize eddy current losses in the core to provide higher power handling inductors. Such cores are thought to provide low resistance with minimum number of coil turns and to provide inductors that are sufficiently efficient at utility power frequencies (50~60 Hz), but audio frequencies typically encompass the range of 20 Hz to 20,000 Hz and higher. The high frequency content typically supplied to loudspeaker systems by digital audio components contain harmonics that were, at one time, thought to be beyond the range of human hearing. Frequencies and amplifier response above 20,000 Hz however are now recognized to affect the quality of sound sensed by the human ear. There is a need, therefore, for a new type of inductor with a high efficiency of high Q value at low frequencies, where such Q value would decrease with frequency to a lower value with increasing frequency giving noticeable sound improvement by virtue of less phase shift to upper harmonics.

The quality and definition of Audio and Video reproduction is affected by the amount of electrical noise and transient voltage spikes superimposed onto the supply line voltage. Generally the smoother the supply voltage sinewave, the better the signal quality and definition which is translated to audio sound or video images. Electrical noise is present in the supply line voltage to audio and video equipment or other appliances and generates false data into the output signal and negatively impacts on the resultant quality. For example "Squiggles" or "fuzziness" is introduced into displayed pictures and impairs the resultant definition, and "hum", "buzz", "ringing" and "blurring" is introduced into the sound output similarly impairing the resultant sound definition.

Electrical noise which affects audio and video output is apparent when superimposed upon the supply voltage (sine wave). Such electrical noise can be further broken down into "Transient" noise and "Spurious" noise. Transient noise takes the form of large peaks—typically of amplitude >1% of the supply voltage. Spurious noise takes the form of a lower amplitude magnitude of less than 1% of the supply voltage. Transient and spurious noise can occur throughout the frequency spectrum. Both high and low frequency spurious noise can affect audio and video quality. High frequency spurious noise (>20 KHz) is often caused for example by other appliances and lighting fixtures powered from the same mains power supply as the audio and video equipment typically has amplitude of <1% of the supply voltage. Spurious low frequency noise (<20 KHz) is often caused by motors and generators connected to the same mains supply.

State-of-the-art power filters have a varying degree of success at filtering high frequency spurious noise. Most are unable to filter low frequency noise without the use of prohibitively expensive large value inductors and capacitors, and all are unable to filter transient noise without causing additional stress on the appliance power supply diodes. Economy generally dictates capacitive input rectification that gates in the noise on the peak portion of the line supply voltage. State-of-the-art filter networks generally have inductors and capacitors in the circuit, however these filters will usually only smooth out and suppress the relatively high frequency noise superimposed on the line voltage. The transient noise (defined as the higher power noise which exhibits higher amplitude than regular electrical noise—typically greater than 1% in relative amplitude) is superimposed upon the voltage as unwanted noise passing through traditional designs. Typical prior art filters have been limited to filtering out noise in excess of 20 KHz due to size and cost constraints associated with the larger inductors needed to effectively filter out lower frequencies. There is a need, then, for a commercially viable solution which will enable power filters and power conditioners to filter of frequencies down to 3 KHz (below which frequency the noise has little effect on picture or sound quality).

State-of-the-art power filters have another disadvantage of causing additional burden and strain on the appliance power supply diodes due to a blocking action on the needed current.

Lastly, the only way to adjust the Q value of an inductor is by selecting a different size of copper winding and/or core size thereby producing multiple inductors of the same value of inductance but with differing direct current resistance and Q values. This is both costly and inefficient. There is at present no effective way of adjusting the Q of an inductor after assembly.

There is a need, therefore, for inductive structures and methods for using inductive structures that overcome these problems.

OBJECTS AND SUMMARY OF THE INVENTION

Accordingly, it is a primary object of the present invention to provide inductive structures and methods for using inductive structures that overcome these problems.

Another object of the present invention is providing a plurality of self-damping inductor structures incorporating one or more eddy current generators which, when designed appropriately, result in improved application performance.

Yet another object of the present invention is providing an electro-dynamic component which, when used in an audio crossover network, is new in character as a reactive part, while offering a loudspeaker the chance to produce a sound fully portraying voice onset transients when speaking (e.g., "Check" "Chick" "Chuck "Testing, one, two Three" etc.), while providing, a realistic vitality to spoken sibilants associated with S, T, & C letters of the alphabet, improving tonal clarity and significantly increasing intelligibility by virtue of minimized phase distortion. The present invention can be applied to high power handling inductors and provide the desirable suppressed Q value which further lowers as frequency increases.

Another object of the present invention is to provide inductive structures with ability to reject or reduce several octaves of unwanted frequencies without depressing or attenuating signals in the desired bandpass frequencies.

Another object of the present invention is to provide a method for adjusting the Q value of inductive structures, after manufacture, in a low-cost manner.

Another object of the present invention is to provide inductive structures which when used in power conditioning equipment enables high frequency band pass to facilitate improved diode action by means of current draw required for large signals, thus allowing the power supplies of connected equipment to work more efficiently.

Another object of the present invention is to provide inductive structures which when used in power supplies or power filtering equipment enables more effective filtering of unwanted spurious and transient electrical noise.

The aforesaid objects are achieved individually and in combination, and it is not intended that the present invention be construed as requiring two or more of the objects to be combined unless expressly required by the claims attached hereto.

An inductor with self-damping properties for use in multiple applications including for high power broadband frequency applications is provided by a coil having an input end and an output end and wound about a core of magnetically permeable material and an eddy current generator incorporated either at the time of manufacture or post manufacturing. The core can comprise in its simplest form Air (i.e. a hollow coil of wire). Alternative core materials are iron, iron powder, steel laminations and other appropriate materials. The core may be incorporated into some form of frame whether I shaped, U shaped, E shaped or of an encapsulated shape arrangement.

In another aspect of the invention, the Q value may be changed selectively by deliberately inducing eddy currents in preferred locations. The eddy currents are induced into the inductors and have the effect of introducing a back EMF which is designed and scaled appropriately to adjust the Q value at the desired frequency resulting is less phase distortion. When phase "distortion" is minimized, waveform is necessarily well preserved. The listener then observes improved clarity, identity, vitality and intelligibility. The phase angle within the response band depends on the roll-off or roll-up slope, be it a $1^{st}$, $2^{nd}$ or $3^{rd}$ order, etc.

By damping inductors used in audio crossover networks, the coil "signature" can be substantially removed in the presence of high level, low frequency pulses characteristic of such instruments as bass drums and kettle drums amongst others. Undamped inductors exhibit considerable overshoot and backswing that is foreign to the acoustic sound. In addition, by reducing the usual 6 dB per octave slope with the introduction of a frequency responding resistance that shunts the inductive reactance with increasing frequency, a reduction in slope and even a moderate reversal in slope minimizes the phase shift by virtue of the Bode criteria as phase compensation, thereby improving the clarity and impact of the reproduced sound.

The quality and performance characteristics of an inductor are often expressed as Q, a figure of merit. The most familiar definition is $Q=X_L/R_{AC}$. The $R_{AC}$ term includes the Ohmic DCR plus a variable or momentary and invisible resistance reflected in series with the DCR in response to copper eddy current loss and iron (if any) hysteresis loss with it's own eddy current loss. Iron hysteresis may vary considerably with excitation level and frequency depending on the core material used. Large amplitude impulses from percussive instruments frequently may challenge the flux density capacity, and the Fourier high frequency components required to support the wave may exceed the intended bandwidth of the material, particularly laminations for low frequencies. This depresses the bass in the overall spectral balance.

In circuit analysis, it is often useful to consider the parallel equivalent of $R_{AC}$, $R_P$. The dissipation factor $D=1/Q$ is then employed to transfer the resistance values as needed. The relationship between $R_{AC}$, $R_P$ and D is as follows:

$$R_P = \frac{1+D^2}{D^2} R_S; \; R_S = \frac{D^2}{1+D^2} R_P, \text{ where } R_S = R_{AC}$$

This relationship also brings into being a second definition, $Q=R_P/X_L$. This second definition provides insight into how the self-damped inductor functions in an electrodynamic fashion offering a new technology in crossover networks to improve loudspeaker projection of sound. In describing the self-damped inductor with LCR measurements, the "Q Ratio" is a good indicator. Q Ratio=HiQ/LoQ where HiQ is the measured Q before being Phase Coherent and the LoQ as measured afterwards. L (inductance) and Q are measured at the usual frequencies, 120 Hz and 1 KHz. At 120 Hz depicting low frequency, the L and Q values are substantially the same. The Q Ratio reduces to unity. At 1 KHz however, high frequency damping is manifest and the Q ratio reduces to a significant number. A Q Ratio of 3 denotes a small decrease in slope from 6 dB/octave to about 5 dB/octave on the lower skirt, usually giving a perceptible improvement in sound. A Q Ratio in the vicinity 5 provides less slope in the vicinity of 3 dB/octave and may decrease further at selected frequencies to 2 dB/octave and even 1 dB/octave. Dynamic measurements verify the higher frequency region slopes.

$R_P$ as used here is the apparent parallel, frequency dependent resistance including an Ohmic portion and a frequency sensitive portion induced across the otherwise high Q inductor.

The value of $R_P$ is selectable for the application as is the frequency dependant portion and its spectrum. $R_P$ is, in a sense, an "invisible" component that is dynamic in character and often permits a more simple circuit of fewer parts at less cost, giving a superior sound for a given enclosure. The superior sound is founded on obtaining less phase distortion, within the prescribed bandwidth based upon the Bode Criteria of Systems Engineering. The cost saving results from no additional components being required to correct phase distortion, having selected the value of $R_P$ and utilized the desirable attributes of $R_P$ accordingly.

Turning to the Bode criteria:-"The phase angle of a network at any desired frequency is dependent on the rate of change of gain with frequency, where the rate of change of gain (slope in dB per octave) at the desired frequency has the major influence on the value of the phase angle at that frequency." (As quoted from the *Reference Data for Radio Engineers*, July 1957). In a loudspeaker crossover network, the steeper the slope in dB per octave, the greater is the phase angle (shift) from the associated "corner", i.e. 3 dB down. It follows that less slope, e.g. –6 dB per octave reduced to –4 or –3 dB per octave, manifests considerably less phase distortion with, applicants have discovered, notable improvement in sound quality and perception.

Although the present invention may be inserted into an existing crossover network with few, if any, changes in associated components, the complete network phasing within the desired band usually warrants adjustment for optimum flatness of response for both the tweeter and woofer combined. Perceptive comparative hearing tests are often more revealing than sophisticated instrumentation just because how and what the ear hears remains to be completely understood. A more highly damped inductor giving a slope around –3 dB/octave offers an alternative juxtaposition of high and low response bands to create an interlaced crossover. This readily provides a slight bass boost which is generally preferred in most listening circumstances. In addition, with an audible extension to the woofer highs within its good performance specification, the tweeter is introduced later in the spectrum to preclude lower frequency overdrive, a common trade-off. This arrangement also provides woofer acoustic support for the tweeter to reduce its power requirement and gives a synchronous backdrop of AM quality sound for a rich depth of sound over a few octaves of the ear's most sensitive region—fuller without being louder per se. Since acoustic summation is not arithmetic, a properly flat response over the hearing spectrum is readily achieved.

In the inductive structure of the present invention, additional eddy currents are generated and the result is enhanced damping properties; the new inductor, when used in an audio cross-over network, causes the network to provide a novel self-damping property.

The present invention when utilized in appropriate power conditioning of filtering equipment provides a means for more effective filtering out the spurious electrical noise and the transient voltages from the supply voltage. Line Filters exist today with known shortcomings. The present invention improves upon the currently available embodiments and know-how, by inducing an additional active contribution to the filtering process of the additional eddy currents generated which are not normally present in prior art inductors. In one embodiment, the eddy currents are generated by inclusion of a floating secondary coil, and the transient noise energy is transferred to the floating secondary by means of a transformer action and so is prevented from passing through. The transient noise energy then appears in the "invisible" $R_{AC}$ across the coil and is dissipated within the secondary coil and the reflected resistance ($R_{AC}$) across the primary coil. Such $R_{AC}$, which appears across the primary inductor coil, increases with frequency thereby providing a means for absorbing the high frequency transient noise energy with increasing efficiency as the frequency of the transient noise increases. Essentially, the eddy currents are induced producing a transformer action with a back EMF or counter EMF (CEMF) which is designed and scaled to absorb and cancel out most of the transient noise.

Because of the additional eddy currents generated, the resultant damping properties of the new inductors used in filter networks, cause the networks to provide more effective transient noise suppression than for circuits including inductors of the prior art.

The inductor apparatus of present invention, when utilized in appropriate power conditioning or filtering equipment, provides a means for more effective filtering out the spurious electrical noise and the transient voltages from the supply voltage than previously experienced. The filter circuits can now, when employing the present invention, be further configured to utilize the generation of eddy currents provided by the invention to provide additional filtering action on transient noise peaks which heretofore have not been dissipated with state-of-the-art inductors used in existing filters.

The apparatus and method of the present invention, when used in an appropriate circuit, will also allow high frequency band pass to facilitate improved diode action by means of current draw required for large signals. This allows the power supplies of Audio and Video equipment to work more efficiently.

The above and still further objects, features and advantages of the present invention will become apparent upon consideration of the following detailed description of a specific embodiment thereof, particularly when taken in conjunction with the accompanying drawings, wherein like reference numerals in the various figures are utilized to designate like components.

BRIEF DESCRIPTION OF THE DRAWINGS

FIGS. 4a–4d illustrate two new symbols; FIG. 4c illustrates a proposed symbol for an iron core component and FIG. 4d illustrates a proposed symbol for an air core component; equivalent circuits are illustrated in two formats—FIG. 4a illustrates discrete components showing a primary and secondary coil with their respective impedances and FIG. 4b illustrates a combined equivalent circuit, in accordance with the method of the present invention.

DESCRIPTION OF THE PREFERRED EMBODIMENT

Figure 1:
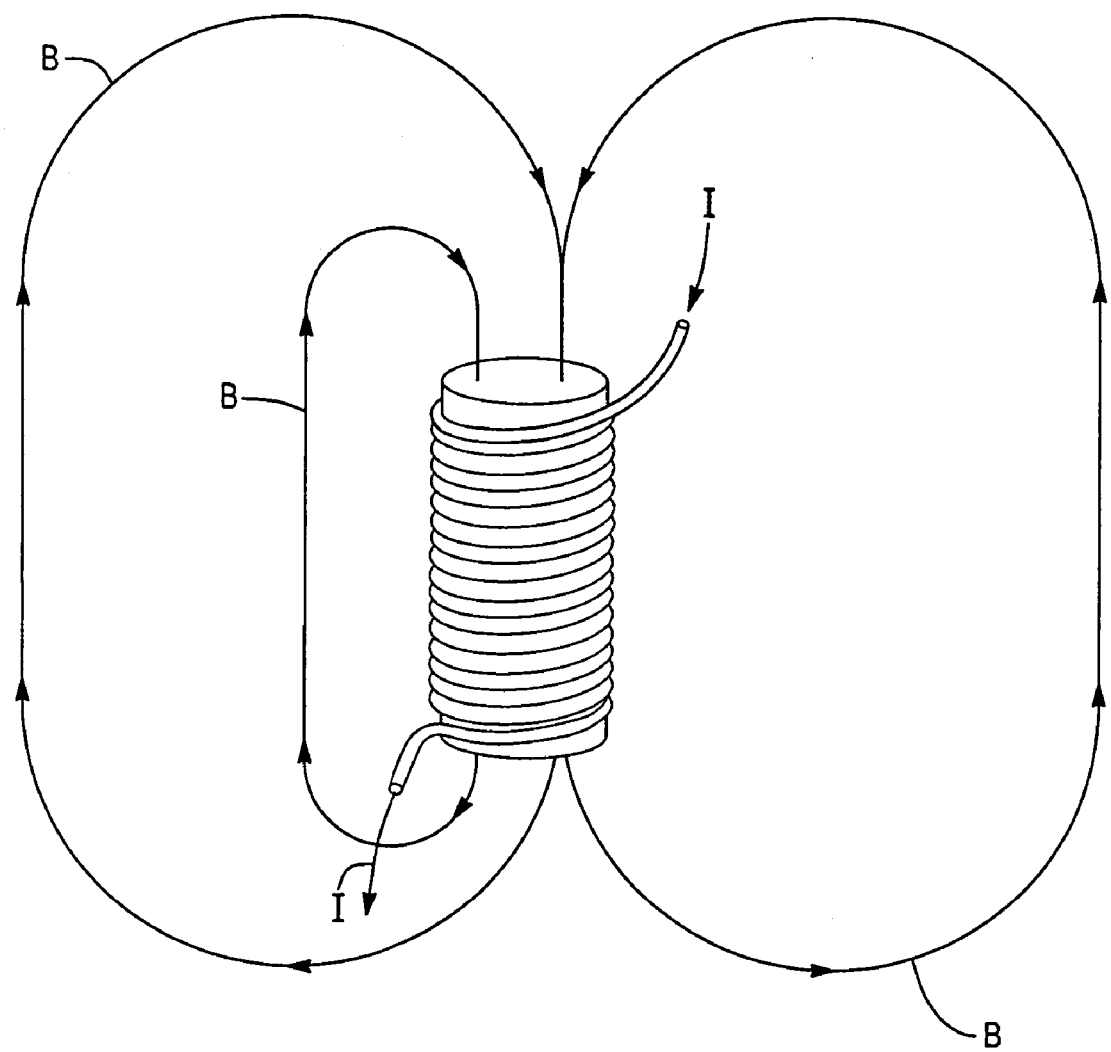
FIG. 1 illustrates a closed loop of magnetic flux of a prior art.
Figure 2:
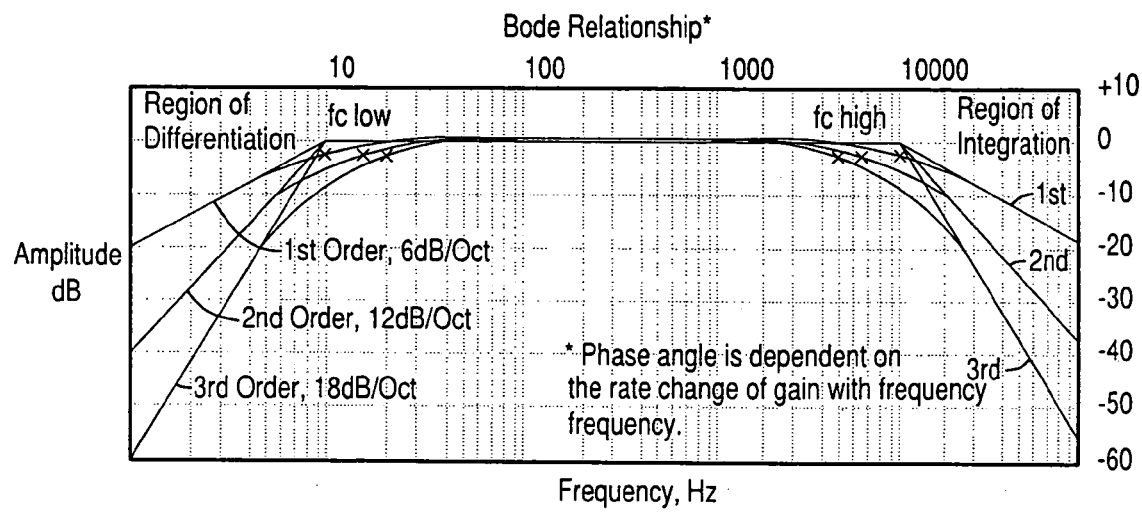
FIGS. 2 and 3 illustrate varying phase angle within the audio response band of a crossover network as a function of the roll-off or roll-up slope, (e.g., $1^{st}$, $2^{nd}$ or $3^{rd}$ order slope), in accordance with the method of the present invention.
Figure 3:
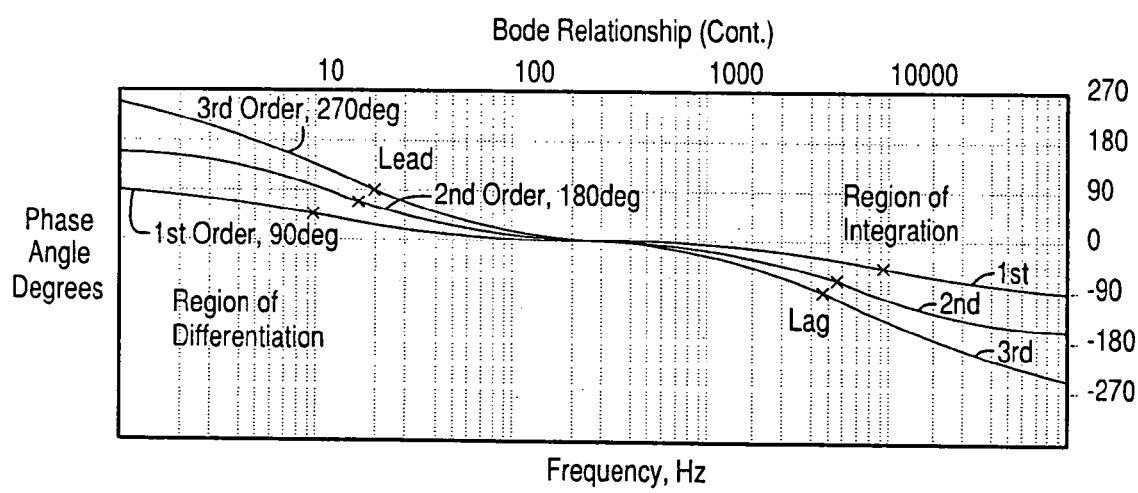
Figure 5:
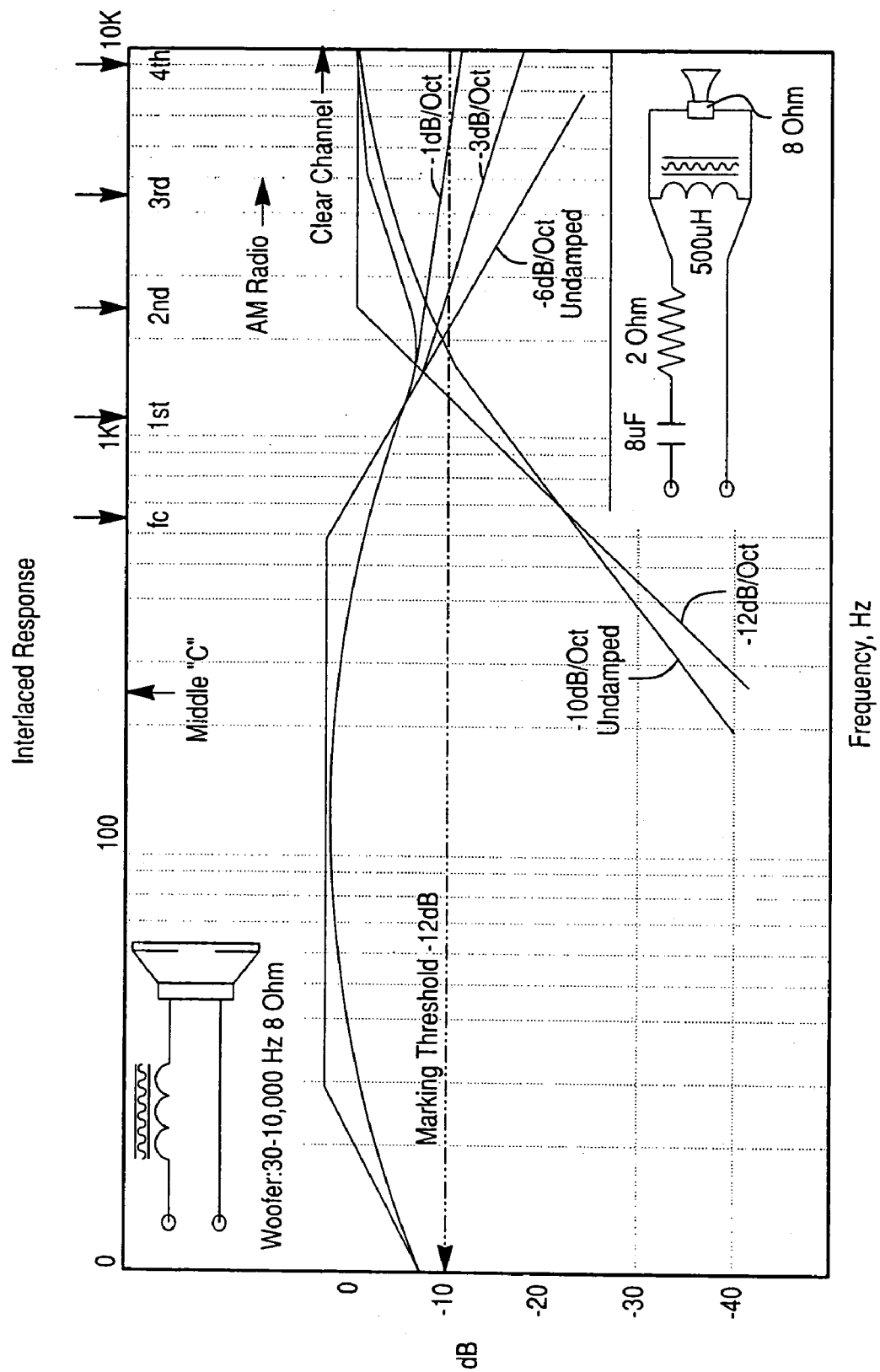
FIG. 5 illustrates an interlaced response for a two-way speaker assuming a properly Phase Coherent enclosure, in accordance with the method of the present invention.

In accordance with one embodiment of the method of the present invention, Q value is changed selectively by deliberately inducing eddy currents in preferred locations. The eddy currents are induced into the inductors and have the effect of introducing a back EMF which is designed and scaled appropriately to adjust the Q value at the desired frequency resulting in less phase distortion. When phase "distortion" is minimized, waveform is necessarily well preserved. The listener then observes improved clarity, identity, vitality and intelligibility. The phase angle within the response band depends on the roll-off or roll-up slope, be it a $1^{st}$, $2^{nd}$ or $3^{rd}$ order, etc. as illustrated in FIGS. 2 & 3.

Turning now to FIGS. 4a–4f, as noted above, in circuit analysis it is often useful to consider the parallel equivalent of $R_{AC}$, $R_P$. The dissipation factor $D=1/Q$ is then employed to transfer the resistance values as needed. The relationship between $R_{AC}$, $R_P$ and D is as follows:

$$R_P = \frac{1+D^2}{D^2} R_S; R_S = \frac{D^2}{1+D^2} R_P, \text{ where } R_S = R_{AC}$$

This relationship also brings into being a second definition, $Q=R_P/X_L$. This second definition provides insight into how the self-damped inductor 50 of the present invention functions in an electrodynamic fashion (e.g., in crossover networks) to improve loudspeaker projection of sound. In describing the self-damped inductor 50 with LCR measurements, the "Q Ratio" is a good indicator. Q Ratio=HiQ/LoQ where HiQ is the measured Q before being Phase Coherent and the LoQ as measured afterwards. L (inductance) and Q are measured at the usual frequencies, 120 Hz and 1 KHz. At 120 Hz depicting low frequency, the L and Q values are substantially the same. The Q Ratio reduces to unity. At 1 KHz however, high frequency damping is manifest and the Q ratio reduces to a significant number. A Q Ratio of 3 denotes a small decrease in slope from 6 dB/octave to about 5 dB/octave on the lower skirt, usually giving a perceptible improvement in sound. A Q Ratio in the vicinity 5 provides less slope in the vicinity of 3 dB/octave and may decrease further at selected frequencies to 2 dB/octave and even 1 dB/octave. Dynamic measurements verify the higher frequency region slopes.

$R_P$ as used here is the apparent parallel, frequency dependent resistance including an Ohmic portion and a frequency sensitive portion induced across the otherwise high Q inductor. New symbols are suggested for the inductors of the present invention in FIGS. 4c and 4d, and inductor 50 has an equivalent circuit is given in FIGS. 4a and 4b.

Figure 6:
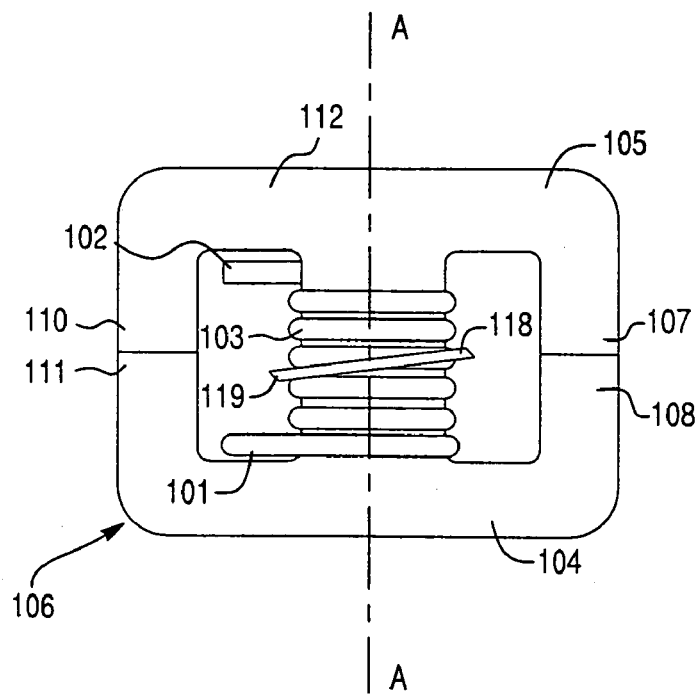
FIG. 6 is a front view of a double "E" frame inductor embodying the present invention with an eddy current generator implemented by means of a floating secondary coil positioned to cut through the electromagnetic field flux path; in this illustrative embodiment, the coil floating secondary coil is depicted on the central leg.
Figure 7:
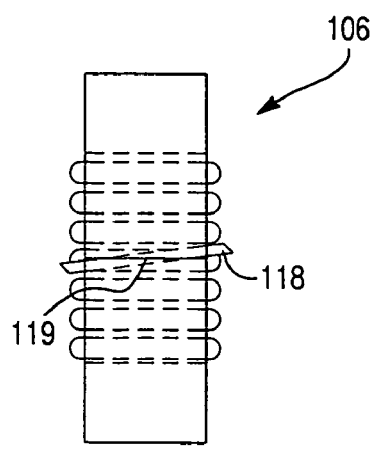
FIG. 7 is a side view of the double "E" frame inductor of FIG. 6 with an eddy current generator implemented by means of a floating secondary coil positioned to cut through the electromagnetic field flux path.
Figure 8:
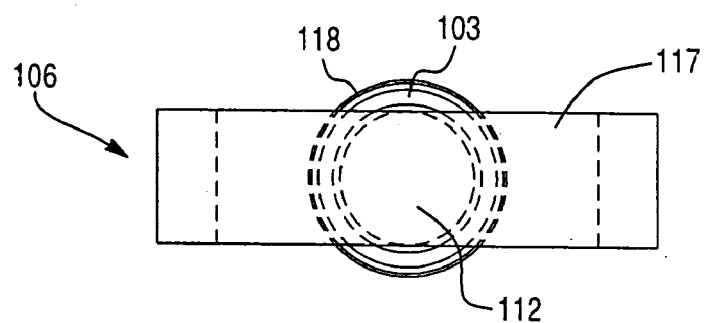
FIG. 8 is a top view of the double "E" frame inductor of FIGS. 6 and 7 with an eddy current generator implemented by means of a floating secondary coil positioned to cut through the electromagnetic field flux path.

Referring to FIGS. 6, 7 and 8, there is illustrated a first embodiment, a simple iron double "E" core inductor 106 (comprising a primary coil of insulated copper wire 103 wound around an iron core 112, core 112 being formed by the central leg of the magnetically permeable "E" frames 104, 105 where an eddy current generator 118 has been added illustrating the teaching of this invention. The eddy current generator is implemented by winding an electrically conductive insulated and isolated secondary coil around the outside of the primary winding. Electrical connection 119 needs to be established between the two ends of the secondary coil 118 to provide a closed conductive loop. The secondary coil 118 as illustrated comprises a single turn of wire; however the secondary coil can consist of a thicker gauge wire or of multiple turns if it is desirable to increase the magnitude of the eddy currents generated. The wire used in the formation of the secondary coil is shown to be of smaller cross-sectional area that the wire used in the primary coil 103. This is typically all that is required; however a wire with larger diameter may be selected for the secondary coil.

The secondary coil 118 is illustrated to be wound around the outside of the primary coil 103. This is shown for ease of representation. The secondary coil may alternatively be positioned inside the primary coil with the primary coil wound on top of the secondary coil. The secondary coil may alternatively be positioned within the windings of the primary coil with the primary coil wound around the secondary coil. A means for generating eddy currents using the floating secondary coil method may be applied using a similar method to other types of inductor (such as Air core, laminated core, powdered iron core, I core, EI core, U core, etc), as will be demonstrated from a review of the other embodiments described below.

Figure 9:
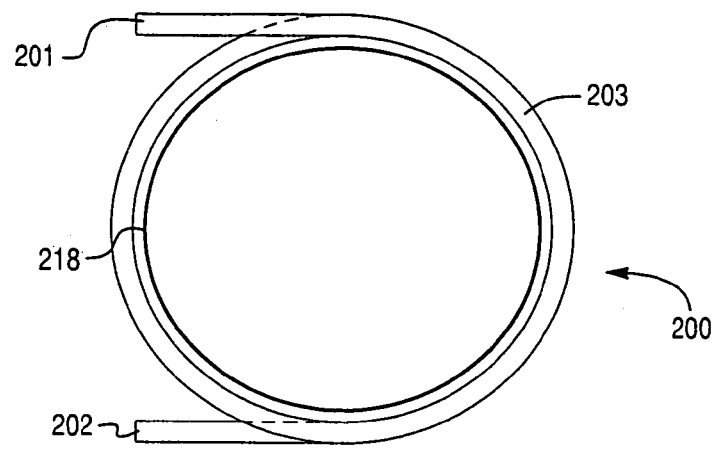
FIG. 9 is a top view, in elevation, of a second embodiment, an air core inductor with an eddy current generator implemented as a floating secondary coil positioned within the air core inductor to cut through the electromagnetic field flux path; in this illustrative embodiment, the floating secondary coil takes the form of thin cylinder of copper former around which the inductor wire windings are wound.
Figure 10:
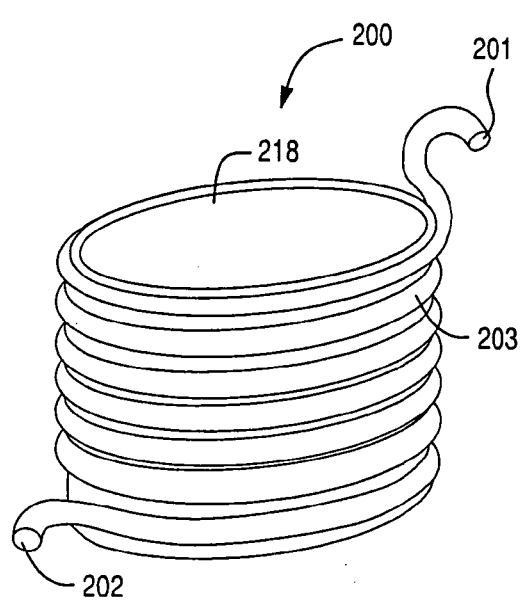
FIG. 10 is a perspective view of the air core inductor of FIG. 9; in accordance with the present invention.
Figure 11:
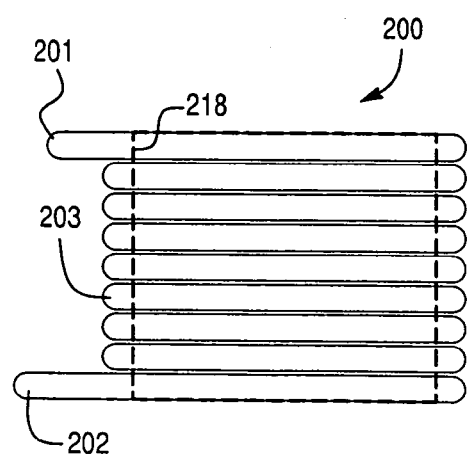
FIG. 11 is a side view, in elevation, of the air core inductor of FIGS. 9 and 10; in accordance with the present invention.

Referring to FIGS. 9, 10 and 11, a second embodiment of a damped inductor is configured as an air core inductor 200 (comprising a primary coil of insulated copper wire 203 wound in a cylinder shape with a resultant air core formed within the coil) where an eddy current generator 218 has been added illustrating the teaching of this invention. The means for generating the eddy currents is effected by inserting a cylinder of an electrically conductive material which is insulated and isolated from the primary coil around the inside of the primary winding. The cylindrical secondary coil 218 is illustrated to comprise a closed conductive loop configured as a bobbin or former made from a thin single sheet of copper; however the secondary coil can consist of a thicker gauge sheet material or of multiple layers if it is desirable to increase the magnitude of the eddy currents generated. The cylinder used in the formation of the secondary coil is shown to be of smaller thickness than the cross-sectional area of the wire used in the primary coil 103. This is typically all that is required; however a cylinder with a larger thickness may be selected for the secondary coil. The secondary former/coil 218 is illustrated to be positioned within the inside diameter of the primary coil. This is shown for ease of representation. The secondary coil 218 may alternatively be positioned outside of the primary coil 203 with the primary coil wound inside the secondary coil. A means for generating eddy currents using the floating secondary coil method may be applied using a similar method to other types of inductor (such as Foil air core, Litz wire air core, laminated core, powdered iron core, I core, EI core, U core etc)

Figure 12:
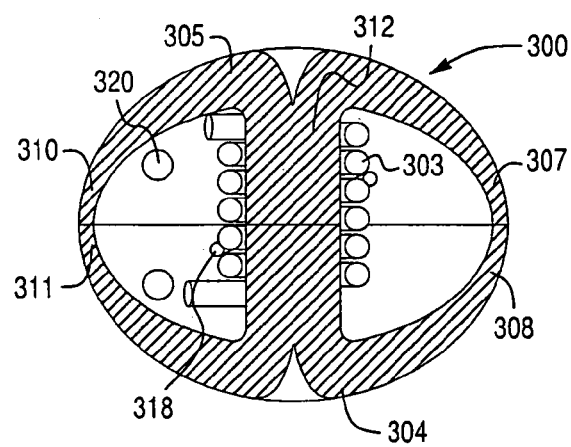
FIG. 12 is a front cross sectional view, in elevation, of a third embodiment comprising a more complex double "E" frame form of an inductor in accordance with the present invention with flux path defining material added to the upper and lower and all around portions of the E frame to capture and define a path for additional electromagnetic flux generated by the coil inductor with an eddy current generator implemented as a floating secondary coil positioned to cut through the electromagnetic field flux path; in this illustrative embodiment, the floating secondary coil is placed on the structure's central leg.
Figure 13:
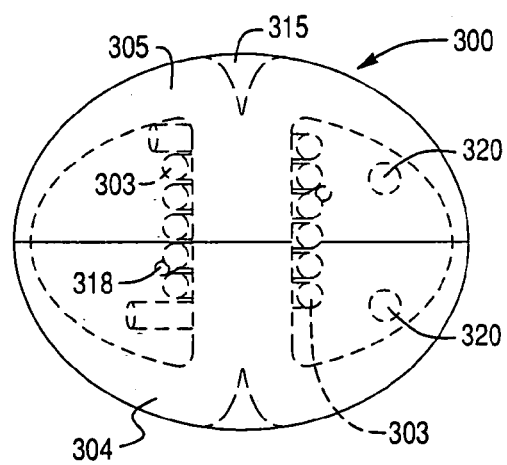
FIG. 13 is a side view, in elevation, of the inductor of FIG. 12; in accordance with the present invention.
Figure 14:
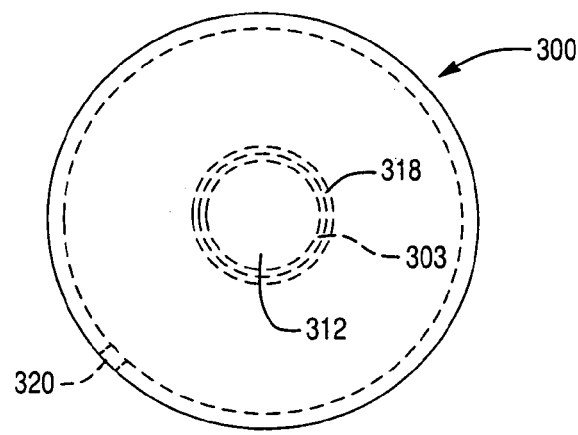
FIG. 14 is a top view, in elevation, of the inductor of FIGS. 12 and 13; in accordance with the present invention.

Referring now to the third embodiment of FIGS. 12, 13 and 14, a more complex iron double "E" core inductor 300 comprises a primary coil of insulated copper wire 303 wound around a symmetrically split iron core frame 304, 305, where an eddy current generator 318 has been added illustrating the teaching of this invention. The means for generating the eddy currents is effected by winding an electrically conductive insulated and isolated secondary coil 318 around the outside of the primary winding 303. An electrical connection 319 needs to be established between the two ends of the secondary coil 318 to provide a closed conductive loop. The secondary coil 318 is illustrated to comprise a single turn of wire; however the secondary coil can consist of a thicker gauge wire or of multiple turns if it is desirable to increase the magnitude of the eddy currents generated. The wire used in the formation of the secondary coil 318 is shown to be of smaller cross-sectional area than the primary coil 303. This is typically all that is required; however a wire with larger diameter may be selected for the secondary coil 318. The secondary coil is illustrated to be wound around the outside of the primary coil. This is shown for ease of representation. The secondary coil 318 may alternatively be positioned inside the primary coil 303 with the primary coil wound on top of the secondary coil. The secondary coil may alternatively be positioned within the windings of the primary coil with the primary coil wound around the secondary coil. A means for generating eddy currents using the floating secondary coil method may be applied using a similar method to other types of magnetically permeable frames.

Figure 15:
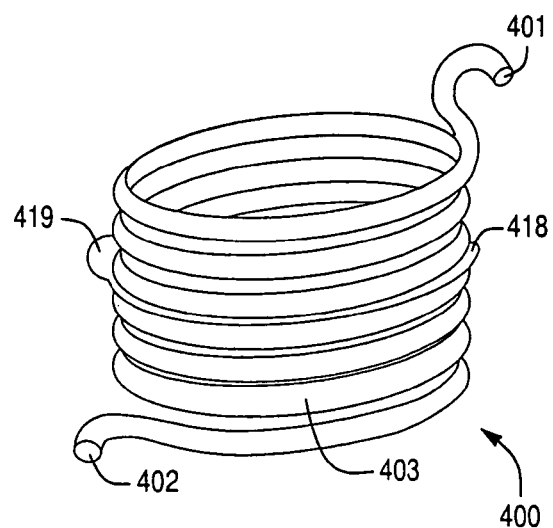
FIG. 15 is a perspective view of a fourth embodiment, an air core inductor with eddy current generator implemented as a floating secondary coil positioned to cut through the electromagnetic field flux path, in accordance with the present invention.
Figure 16:
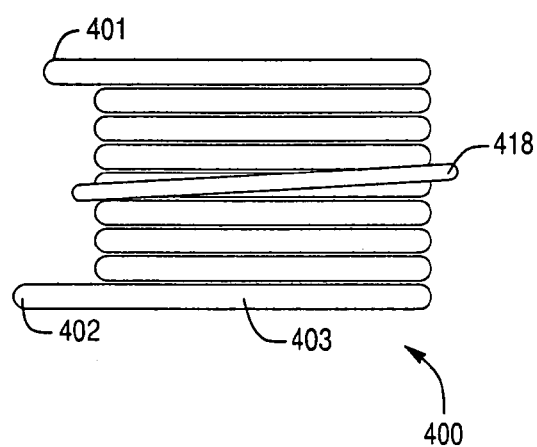
FIG. 16 is a side view, in elevation, of the inductor of FIG. 15; in accordance with the present invention.
Figure 17:
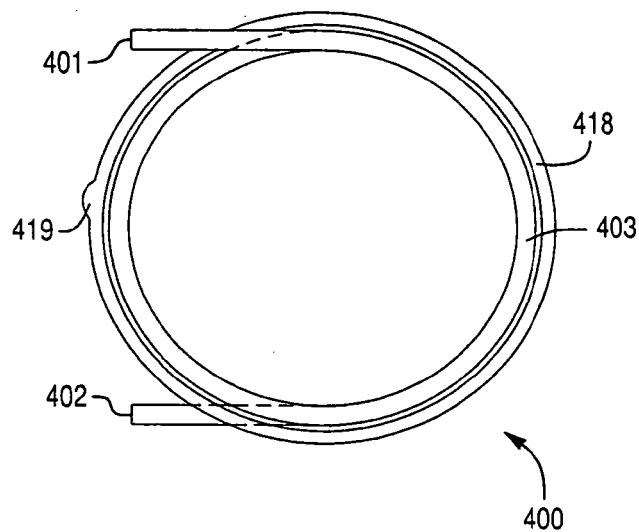
FIG. 17 is an end view, in elevation, of the inductor of FIGS. 15 and 16; in accordance with the present invention.

Referring now to the fourth embodiment of FIGS. 15, 16 and 17, there is illustrated an air core inductor 400 (comprising a primary coil of insulated copper wire 103 wound in a cylinder shape with a resultant air core formed within the coil) as is commonly available in the market) where an eddy current generator 418 has been added illustrating the teaching of this invention. The means for generating the eddy currents is effected by winding an electrically conductive insulated and isolated secondary coil 418 around the outside of the primary winding 403. Electrical connection 419 needs to be established between the two ends of the secondary coil 418 to provide a closed conductive loop. The secondary coil 418 is illustrated to comprise a single turn of wire; however the secondary coil can consist of a thicker gauge wire or of multiple turns if it is desirable to increase the magnitude of the eddy currents generated. The wire used in the formation of the secondary coil is shown to be of smaller cross-sectional area than the wire used in the primary coil 403. This is typically all that is required; however a wire with larger diameter may be selected for the secondary coil. The secondary coil is illustrated to be wound around the outside of the primary coil. This is shown for ease of representation. The secondary coil may alternatively be positioned inside the primary coil with the primary coil wound on top of the secondary coil. The secondary coil may alternatively be positioned within the windings of the primary coil with the primary coil wound around the secondary coil. A means for generating eddy currents using the floating secondary coil method may be applied using a similar method to other types of inductor (such as Foil air core, Litz wire air core, laminated core, powdered iron core, I core, EI core, U core etc).

Figure 18:
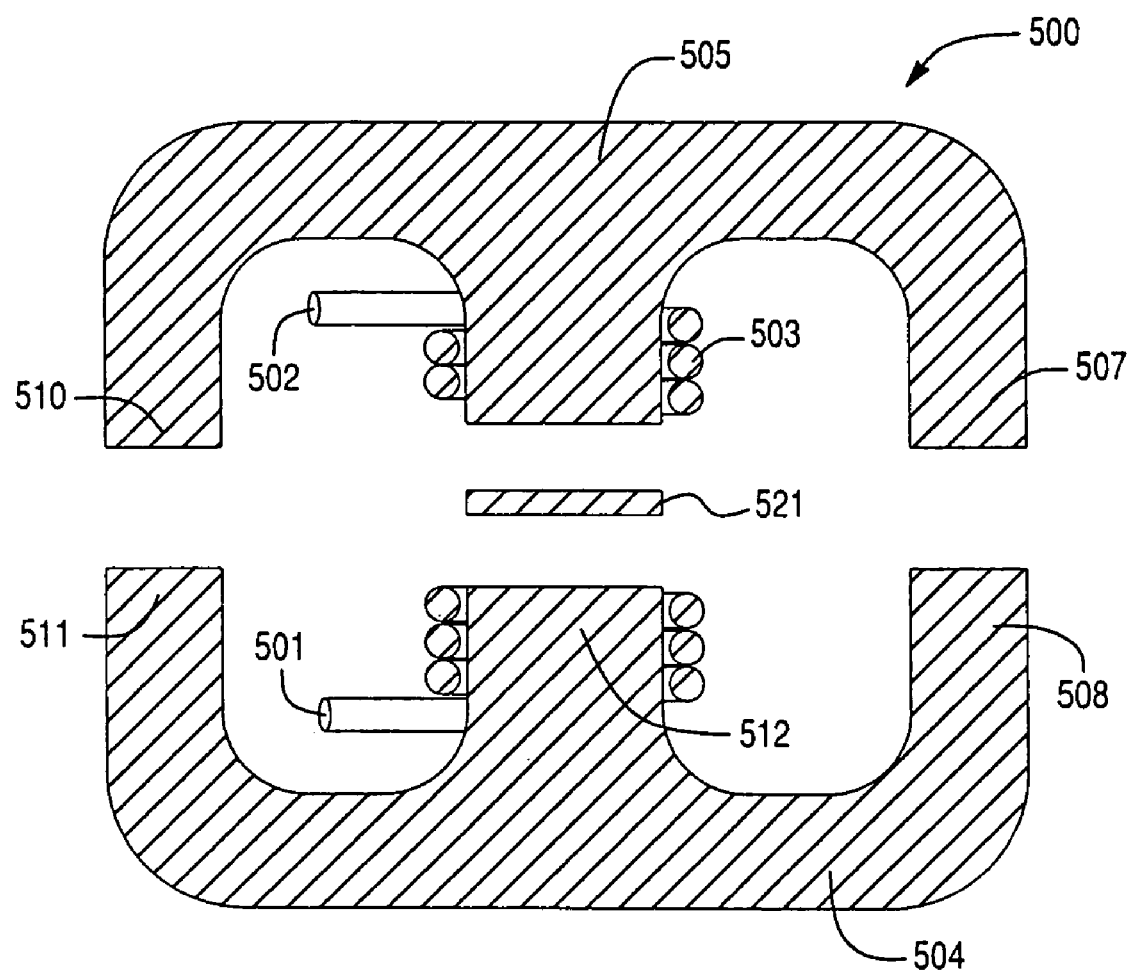
FIG. 18 is an exploded cross sectional illustration of a fifth embodiment, an iron core inductor with an eddy current generator implemented by means of a floating secondary plate positioned to cut through the electromagnetic field flux path illustrating the teaching of this invention; when assembled, the outside legs of the frame will mate without any air gap, and the floating secondary plate is clamped between the mating faces of the core.

Referring to the fifth embodiment of FIGS. 17 and 18, an iron double "E" core inductor 500 comprises a continuous primary coil of insulated copper wire 503 wound around an iron core 512 formed by the central leg of "E" frames 504, 505, and an eddy current generator 521 has been added illustrating the teaching of this invention. The means for generating the eddy currents is effected by inserting a secondary insulated and isolated plate 521 of electrically conductive material in the middle of the iron core. It is preferable that the material of the plate is of different magnetic permeability than the material of core frame members 504, 505, in which case it is not necessarily required to ensure electrical insulation and isolation between the plate and frame members 504, 505, since the difference in electromagnetic permeability of the plate material and the frame core material usually has a larger impact on the effectiveness of the eddy current generating device than the electrical isolation of the plate. In the exploded illustration of FIG. 19, the core material comprising the middle legs 512 of the two "E" frames are aligned along an axis or are positioned in the same vector and plane to meet half way through the primary coil 503 (the continuous primary coil being wound around the core 512). A plate of electrically conductive material 521 is positioned between the mating faces of the core legs 512. Preferably, the outer legs of the "E" frames 104 & 105 will mate cleanly together without air gap. The plate may be insulated from the iron core or maybe electrically connected to the core; however the plate should be insulated from the continuous primary winding 503. The orientation of the plate shown in this illustration is such that the plate cuts the magnetic flux lines passing through the iron core of the inductor perpendicularly to the flow lines. This provides the most effective means of generating eddy currents when adopting the floating secondary plate method of eddy current generation. The secondary plate 521 may alternatively be positioned inside the core with an orientation not perpendicular to the magnetic flux line path. The secondary plate may alternatively be positioned away from the midpoint of the primary coil. A means for generating eddy currents using the floating secondary plate method may be applied using a similar method to other types of inductor (such as Air core, laminated core, powdered iron core, I core, EI core, U core etc). A means for generating eddy currents using the floating secondary plate method may be applied where the conductive material cutting the flux path is not planar. A means for generating eddy currents using the floating secondary plate method may be applied where the conductive material cutting the flux path may be positioned outside of the core flux path, for example at one end of the coil.

Figure 20:
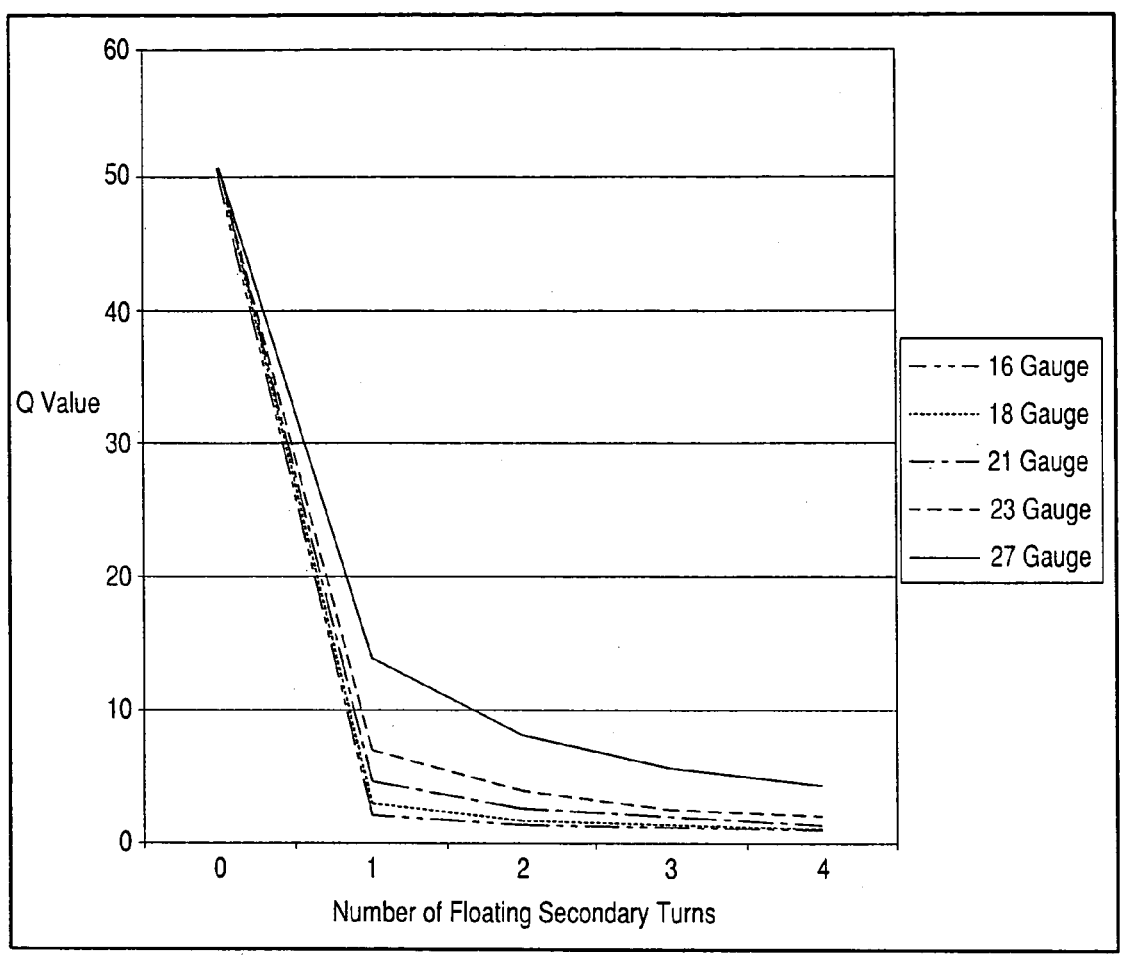
FIG. 20 is a diagram illustrating the measured variations in Q value (for the Double "E" core Inductor of FIGS. 6–8) as floating secondary wires are added, showing differences for selected wire gauges and number of turns, in accordance with the method of the present invention.

Turning now to FIG. 20, a dramatic reduction of Q value is achieved through the addition of floating secondary winding(s). Q tends to be progressively further reduced as the number of turns and the wire gauge thickness of secondary are increased.

Generally speaking, the damped inductor of the present invention preferably includes a flux path defining member such as a solid frame comprising two parts (e.g., 104 and 105). The flux path defining member parts (e.g., 104, 105) fit together with the seam or joint being perpendicular to the longitudinal length of the core (e.g., 112). Each flux path defining member part (e.g., 104, 105) comprises a core (e.g., 112) and side legs (e.g., 107, 108, 110, and 111). A coil (e.g., 103) having an input end (e.g., 101) and an output end (e.g., 102) is wound around the core (e.g., 112) or onto a former or bobbin (not shown). The flux path defining member (e.g., solid frame 104 & 105) in this instance is made of a powdered iron material of relatively high permeability, however, as noted above, the invention is appropriate for use with inductors of multiple core materials and geometric configurations.

The core 112 has a longitudinal length which extends along an axis (e.g., labeled A—A in FIG. 6). The legs of the frame 107, 108, 110, 111, have the same longitudinal length and should match that of the core 112 for maximum efficiency, to ensure a clean fit together, and to avoid the creation of fringing magnetic fields near the joining points of the two frame parts 104, 105, since fringing flux that is not contained within the core causes problems with nearby components. The two frame parts 104, 105 lie in abutting relationship with each other to complete the magnetic circuit for flux created by current in the coil 103.

The flux linkage for the inductor shown in FIGS. 12–14 is greater to that for the inductor shown in FIG. 6–8 by virtue of further extending the base 117 of the frame 104, 105 to harness (or capture) the flux into the frames 104, 105 which emanates from the sides and the top of the coil 103. By comparison, flux defining encapsulating core segments 304, 305 extend and wrap down to join frame edges 307, 308 to form an almost spherical frame shape, thus "encapsulating" the coil. The eddy current generating device works more efficiently in the design depicted in FIGS. 12–14 by nature of a higher flux linkage associated with the design of inductor 300.

In another aspect of the invention, a larger inductor is provided which is capable of handling the high currents produced by extremely high powered audio amplifiers. Amplifiers rated to produce wattages of one thousand (1000) watts or more may deliver currents of the order of magnitude of ten amps to acoustic transducer components including loudspeakers and crossovers. Designers have heretofore generally selected iron laminations or tape cores to create inductors of suitable values capable of handling such power. However iron laminations, or tape cores for that matter, become lossy at high audio frequencies, (e.g. above 1 KHz). This generates additional heat in the copper winding as well as in the iron. The result is a degradation of the inductor Q, a figure of merit defined by $Q=X_L/R_{AC}$ where $X_L$ is the inductive reactance and $R_{AC}$ is the total resistance over the entire bandwidth of the excitation of the inductor and includes the direct current resistance $R_{DC}$. By algebraic transposition this may be expressed as $R_{AC}=X_L/Q$. The difference between $R_{AC}$ and $R_{DC}$ is an induced series resistance; $R'_S$, reflected as a loss or barrier to current at the specified frequency and is present as long as that excitation exists at the inductor. This additional resistance includes the copper eddy current loss and hysteresis loss of the magnetizing material, all of which must be supplied by the amplifier into its load. This is often considered as a parallel resistance $R_P$, across the inductor, but also expresses itself as $R'_S$ which is related by the Dissipation factor D, and D=1/Q. Thereby, $R'_S=(D^2/1+D^2) R_P$ by definition.

Also $R_{AC}=R_{DC}+R'_S$ with $R'_S$ depending on the inductor Q at high frequencies, e.g., 1 KHz or more. It follows that Bass audio output is depressed at any instant that high frequency excitation is present. So $R_{AC}$ is a significant consideration in broadband performance over several octaves of audio. The flux optimized inductors are uniquely suited to achieving high Q by virtue of their contained magnetic circuit without flux loss and the employment of iron with uniformly high permeability over the entire audio spectrum and two or three octaves beyond as in digital processing. Such high current in an inductor calls for a highly efficient inductor design (with a corresponding high Q value—Q being a figure of merit of the inductor) which can achieve a high inductance value at extremely low direct current resistance (DCR). The designs shown in FIGS. 5, 8, 11, 18 all achieve higher Q values than possible heretofore. With such high Q and by nature of the very high flux utilization characteristics results in less copper windings being required to achieve the desired inductance value.

However in audio crossover networks, it is now recognized that the rate of change of gain (which is related to the Q value) induces phase change having a negative affect and altering the harmonics. Such changes to the phase relationship and harmonics have a negative affect on the quality of tone or timbre. Self-damping coils provide the benefit of reducing the Q value of the coil at high frequencies (with negligible effect to the Q value at low frequencies). This phenomenon is of particular use allowing the self-damping properties of the coil to induce a reduced rate of change of gain thus reducing the negative impact on phase shift and harmonics.

Figure 19:
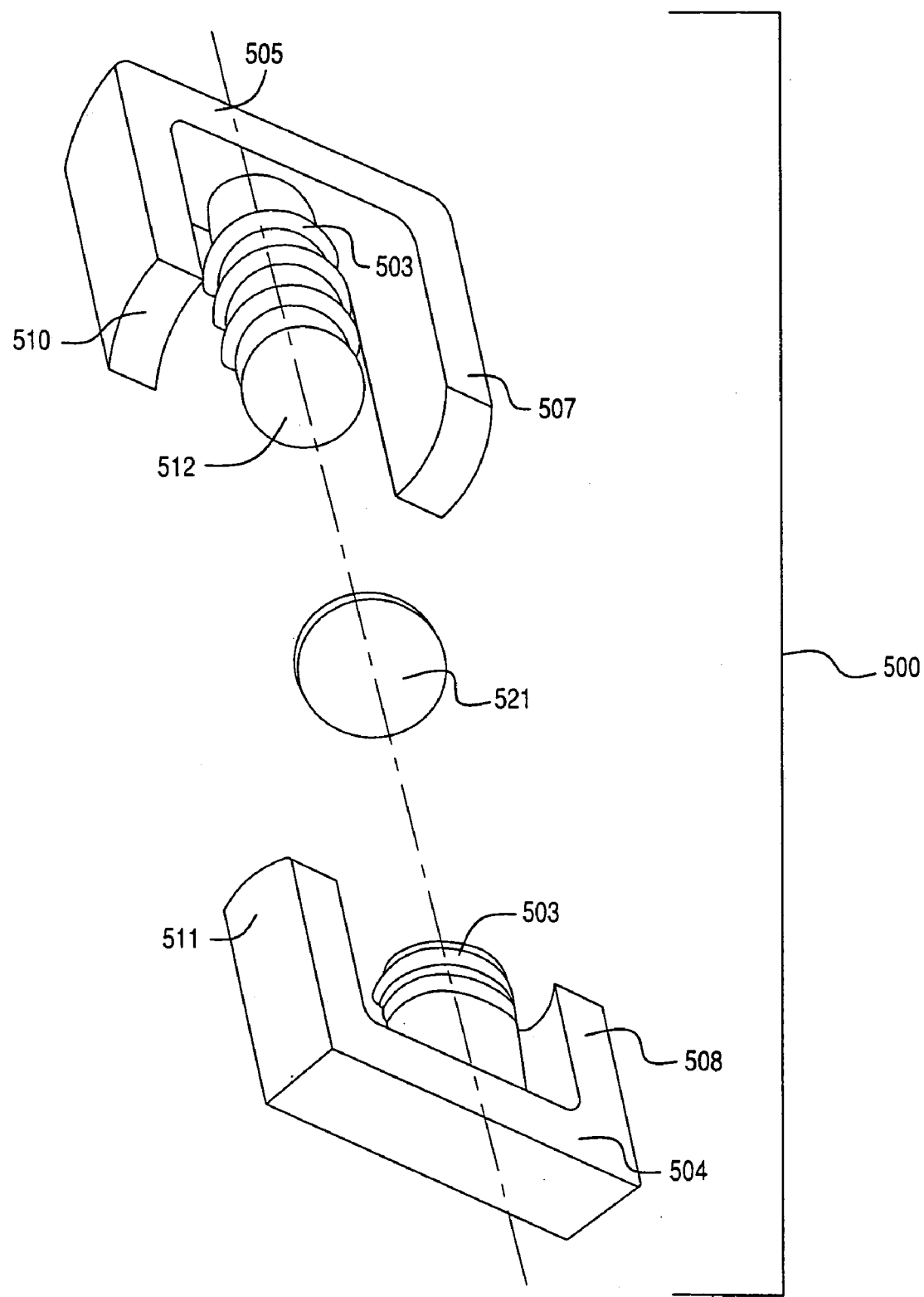
FIG. 19 is an exploded perspective view of the inductor of FIG. 18, in accordance with the present invention.

In another aspect of the invention, where the eddy current generator is implemented by means of a floating secondary plate (in for example, a double "E" core construction of powdered iron material as shown in FIGS. 18 and 19), the effect of introducing the non-magnetic material within the core, has the additional benefit of further linear-izing the intrinsically linear-ized powdered iron magnetic circuit. The non-linear magnetizing current associated with the iron core materials is thereby reduced to minimize further the harmonic distortion to being imperceptible in many applications.

Where the damping is induced by the addition of a relatively loosely coupled floating secondary coil (in for example, a double "E" core construction of powdered iron material illustrated in FIG. 6) using relatively fine wire to induce eddy current loss at higher frequencies, this has the effect of reducing the usual high Q considerably so as to progressively shunt the ever increasing inductive reactance, thus obtaining phase compensation. Since eddy current loss increases as the square with increasing frequency and inductive reactance increases linearly with frequency, the eddy loss resistance overtakes the inductive reactance quickly over a few octaves. Depending on the associated turn ratio of the floating secondary in the present invention, the floating secondary may use a bifilar or trifilar winding to obtain the desired value of the frequency responding resistor, $R_f$ is equal to or greater than $R_P$.

Another feature which has been observed to improve the sound further by virtue of additional damping of the inductor externally to complement the coil floating secondary, is to employ a further "frame floating secondary" at significant locations about the circumference of the "E" core frame. Thin foil of electrically conductive material of suitable size and thickness, preferably insulated and isolated from the frame, is appropriate for the formation of the external floating secondary, with the two ends of the external floating secondary foil electrically connected together. Alternatively if a material for the external floating secondary used is dissimilar to the frame material, then it is not necessary to insulate and isolate the external floating secondary from the frame. It has been observed that an aura of flux travels on the immediate outer surface of the powdered iron frame. If the frame is placed on or very close to a metal surface (as in mounting), the Q is noticeably reduced. Similarly as long as the external frame floating secondary couples sufficiently to the surface flux to reflect some eddy current loss, it provides some additional damping contribution. When such external frame floating secondary is used in conjunction with a coil floating secondary crystal clear, dynamic sound with superb fidelity can be achieved. This also negates any close-by mounting structure effect or metallic component effect.

In the event that the non-linear magnetizing current associated with iron core inductor structures is unacceptable in a given situation, then an air core inductor (e.g., as illustrated in FIGS. 15, 16, 17) is preferred, since it exhibits its own signature in many applications and lends itself to self-damping. Should it be desirable to increase the damping still further, instead employing a strand of wire as the floating secondary, a turn of thin electrically conductive foil may be wrapped around the air core with the two ends of the foil electrically connected together; the foil cylinder will act as a single turn floating secondary eddy current generator as well as an external frame floating secondary, as discussed above. The dimensions and material selection of the conducting material used in such a floating secondary (e.g. copper, brass, aluminum etc.), determines the degree of damping and the spectrum over which it functions.

In another aspect of the invention, the applicants have discovered that loudspeakers with crossovers using the inductor of the present invention appear to have another beneficial effect; specifically on loudspeakers placed in rooms exhibiting acoustical problems with standing waves. As noted above, eddy currents are generated by means of the inclusion of a floating secondary coil, and the energy created by a back EMF (for example generated from the microphone effect of the loudspeaker driver where "standing wave" sound energy causes the speaker cone to oscillate in a manner detrimental to the desired propagation of sound from the loudspeaker) is transferred to the floating secondary by means of a transformer action and thus absorbed. The back EMF generated by the "standing wave" is absorbed or dissipated; the absorption of that energy causes a cancellation effect upon the "standing wave" which provides a very desirable attribute, hereto not possible, in loudspeaker systems. The back EMF energy appears in the "invisible" $R_{AC}$ across the coil and is dissipated within the secondary coil and the reflected resistance ($R_{AC}$) across the primary coil. Such $R_{AC}$, which appears across the primary inductor coil, increases with frequency thereby providing a means for absorbing the back EMF energy with increasing efficiency as the frequency of the back EMF increases. Essentially, the eddy currents are induced producing a transformer action with a back EMF or counter EMF (CEMF) which is designed and scaled to absorb and cancel out most of the standing wave energy.

Because of the additional eddy currents generated, the resultant damping properties of the self-damped inductors used in audio crossover networks cause the network to provide more effective standing wave suppression than previously experienced.

It is recognized that for any inductor utilizing a core material (other than an air core), linearity and swing of inductance value L may be affected and vary as frequency changes. If that is a design concern, it is generally accommodated by allowing a small air gap between the two halves of the frame (e.g., 104 & 105) in the center core only. This will have the effect of increasing the linearity while reducing the inductance L. The meeting faces of the frame legs external to the coil should still be mated without any air gap. Since the large air gap that may be needed between the two frame halves is confined within the coil, and typically located centrally and perpendicular to the coil axis, it is feasible to select an appropriate conductive material and thickness for use in a floating secondary plate which will both generate the desired eddy currents, while at the same time contributing to the desired increased linearity and reduction in L. This provides a unique and valued advantage in many compact electronic assemblies.

The exemplary embodiments of FIGS. 6 though 19 illustrate eddy current generators as they pertain to iron core inductors and air core inductors. It should be noted that eddy currents may be generated by the insertion of any appropriately shaped and positioned electrically conductive material cutting through the electromagnetic flow path. Where the magnetic flux produced by the inductor coil is not perfectly contained within a frame design, the eddy current generator may be effected by positioning electrically conductive material around the outside of the frame. Further, an eddy current generator of some means may be added to any type of inductor coil and is not limited to use with iron core or air core inductors.

It has been discovered by the inventors that an inductor of the configuration of the invention which is self-damped by means of incorporating an eddy current generator (e.g., 118, 121) will have an effect on the "Q" value of the inductor. As shown in FIG. 20, the Q value varies in response to the placement of a single turn floating secondary wire of decreasing wire gauge. As the graph of FIG. 20 shows, the Q value is decreased when compared with an un-damped inductor (e.g., with no floating secondary). As the number of floating secondary turns increases, and the floating secondary wire gauge increases in thickness, so the Q value decreases further. This novel result seems counter-intuitive because the Q value varies directly with the inductive reactance which is in turn, equal to $2\pi fL$. Since the frequency and the inductance remains constant across the readings, theoretically the Q value should remain constant. The inventors speculate that the floating secondary is causing a reduction in the effective value of the AC resistance. It should be noted that the Q value decreases with the increase of frequency while the Inductance "L" remains substantially constant.

While the cores (e.g. 112 in FIG. 6 or 512 in FIG. 19) have been described as cylindrical and shown as right circular cylinder where the coil (e.g., 103) is wound, the self-damping properties are demonstrated with other cylindrical shapes including rectangular, elliptical and polygonal cylinders. In addition, while the frame shape has been described as double "E" shaped, it should be understood that the term "E" frame is intended to encompass other curved or rectilinear shapes that connect the magnetic circuit at either end of the core that might not be, strictly speaking, in the classical shape of an "E". In addition the self-damping properties will also be experienced when the floating secondary means is applied to inductors which do not utilize a frame design facilitating the completion of the magnetic circuit.

It will be appreciated by those of skill in the art that a number of improvements are made available by the present invention, for example, a means of incorporating an eddy current generator into the construction of any type of inductor or inductive device for providing additional self-damping properties to the inductor; an inductor where the eddy currents are generated by means of a floating secondary coil element superimposed around, within or inside the primary inductor coil where such floating secondary coil element comprises a single turn of electrically conductive wire or multiple turns of electrically conductive wire where such wire is electrically isolated from the primary inductor coil and the ends of such wire are electrically connected together such that induced current may flow around the floating secondary coil element. The present invention also contemplates an inductor where the eddy currents are generated by means of a floating secondary coil element superimposed around, within or inside the primary inductor coil where such floating secondary coil element comprises a single turn of electrically conductive foil or multiple turns of electrically conductive foil where such foil is electrically isolated from the primary inductor coil and the ends of such foil are electrically connected together such that induced current may flow around the floating secondary coil element. The present invention also contemplates an inductor where the eddy currents are generated by means of more than one floating secondary coil elements superimposed around, within or inside the primary inductor coil where such floating secondary coil elements comprises a single turn of electrically conductive wire or foil or multiple turns of electrically conductive wire or foil where such floating secondary elements are electrically isolated from the primary inductor coil and each other. The ends of each individual floating secondary element wire are electrically connected together such that induced current may flow around each of the floating secondary coil elements (independent from the other floating secondary coil elements). The present invention also contemplates an inductor where the eddy currents are generated by means of a floating secondary plate element superimposed around, within or nearby the core of the primary inductor coil where such floating secondary plate element comprises a single piece of electrically conductive material of different electromagnetic permeability to that of the core material or multiple pieces of electrically conductive material where such material is electrically isolated from the primary inductor coil. The present invention also contemplates an inductor where the eddy currents are generated by means of an external floating secondary coil element or elements superimposed around or nearby the primary inductor coil and/or around or nearby the inductor frame (if present) where such floating secondary coil element or elements comprise a single turn or multiple turns of electrically conductive wire or foil or multiple turns of electrically conductive wire or foil where such wire is electrically isolated from the primary inductor coil and the ends of such element or elements are electrically connected together such that induced current may flow around each of the external floating secondary coil elements; an inductor including multiple means of incorporating more than one eddy current generator of the same or different type of eddy current generator into the construction for providing additional self-damping properties to the inductor; an inductor structure of the above where two or more coils of primary and secondary windings are wound around the core, providing a means of inducing current flow in secondary coils through transformer action. The present invention also contemplates an inductor structure of the above where the core is a separate movable part within the frame, where upon excitation, the magnetic forces cause the core to move in the axial plain thereby forming an actuating device or solenoid; an inductor structure of the above where a gap is established between the two mating faces of the core. The gap may be left as an air gap or filled in either completely or partially with a non-ferrous material or combinations of materials. The present invention includes eddy current generating devices for all types of inductors and is not limited to improvements with respect to only audio and power filtering applications. Self damped inductors as disclosed above also improve the operation and efficiency of transformers, ballasts, motors, solenoids, generators as well as cleaning up the actions of capacitors and rectifiers, etc.

The terms and expressions which have been used in the foregoing specification are used as terms of description and not of limitation, and there is no intention, in the use of such terms and expressions, of excluding equivalents of the features shown and described or portions thereof. Having described preferred embodiments of a new and improved method, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A damped electromagnetic inductor device, comprising:
   at least one primary coil formed of a continuous conductor having first and second terminal ends, each primary coil having a helical winding section wound around an interior space, said at least one primary coil capable of producing magnetic field lines, wherein the interior space is intersected by said primary coil magnetic field lines;
   at least one secondary closed loop formed of a continuous conductor and being electrically insulated from said primary coil, said secondary closed loop having a section wound around said interior space, said secondary closed loop capable of producing eddy currents in response to said primary coil magnetic field lines; and
   wherein said secondary closed loop continuous conductor comprises a single closed cylindrical loop made from a conductive sheet.

2. The damped electromagnetic inductor device of claim 1, wherein said at least one secondary closed loop conductive sheet is disposed within the interior of said at least one primary coil.

3. The damped electromagnetic inductor device of claim 2, further comprising:
   a magnetically permeable core dimensioned to fit within said interior space, said core carrying (a) said primary coil's magnetic flux and (b) flux induced from eddy currents induced in said closed loop when current flows through said primary coil.

4. The damped electromagnetic inductor device of claim 3, wherein said magnetically permeable core is made of iron.

5. The damped electromagnetic inductor device of claim 1, wherein said at least one secondary closed loop conductive sheet is disposed around the exterior of said at least one primary coil.

6. The damped electromagnetic inductor device of claim 5, further comprising:
   a magnetically permeable core dimensioned to fit within said interior space, said core carrying (a) said primary coil's magnetic flux and (b) flux induced from eddy currents induced in said closed loop when current flows through said primary coil.

7. A damped electromagnetic inductor device, comprising:
   at least one primary coil formed of a continuous conductor having first and second terminal ends, each primary coil having a helical winding section wound around an interior space, said at least one primary coil capable of producing magnetic field lines, wherein the interior space is intersected by said primary coil magnetic field lines;
   at least one secondary closed loop formed of a continuous conductor and being electrically insulated from said primary coil, said secondary closed loop having a section wound around said interior space, said secondary closed loop capable of producing eddy currents in response to said primary coil magnetic field lines wherein said magnetically permeable frame comprises first and second encapsulating flux conductive frames,
   said first flux conductive frame having a substantially hemispherical or bowl-shaped outer wall encircling an annular interior space that surrounds a first central core projecting into the frame's interior, said central core being aligned along a central axis and terminating in a distal core end;
   said second flux conductive frame also having a substantially hemispherical or bowl-shaped outer wall encircling an annular interior space that surrounds a second central core projecting into the second frame's interior, said second central core being aligned along a central axis and terminating in a second distal core end;
   wherein said first flux conductive frame and said second flux conductive frame are releasably juxtaposed together such that the first and second outer walls engage one another to define an enclosed interior volume dimensioned to receive said first coil and said second coil;
   said first and second central cores being substantially coaxially aligned to carry said primary coil and said secondary closed loop; and
   wherein said first central core's distal end engages said second central core's distal end to provide a substantially continuous flux path through said first and second central cores and through said first frame's wall and said second frame's wall.

8. The damped electromagnetic inductor device of claim 7, wherein said first and second encapsulating flux conductive frames define substantially continuous outer wall surfaces meeting in a tight seam, and wherein said primary coil's first and second terminals comprise flexible conductors brought outside of the enclosed interior volume through at least a first aperture in one of said first frame's wall and said second frame's wall.

9. The damped electromagnetic inductor device of claim 7, wherein said magnetically permeable frame is made of iron.

* * * * *